(12) United States Patent
Kozicki

(10) Patent No.: US 6,469,364 B1
(45) Date of Patent: *Oct. 22, 2002

(54) PROGRAMMABLE INTERCONNECTION SYSTEM FOR ELECTRICAL CIRCUITS

(75) Inventor: Michael N. Kozicki, Phoenix, AZ (US)

(73) Assignee: Arizona Board of Regents, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/386,800

(22) Filed: Aug. 31, 1999

Related U.S. Application Data
(60) Provisional application No. 60/098,608, filed on Aug. 31, 1998.

(51) Int. Cl.⁷ ............................................... H01L 29/00
(52) U.S. Cl. ........................ 257/529; 257/773; 365/182
(58) Field of Search ............................ 257/3, 529, 773, 257/758, 668, 522, 634, 644; 438/106, 600; 365/182, 100, 107, 163; 250/372

(56) References Cited

U.S. PATENT DOCUMENTS

| | | | |
|---|---|---|---|
| 5,427,979 A | * | 6/1995 | Chang ........................ 438/600 |
| 5,761,115 A | * | 6/1998 | Kozicki et al. ............. 365/182 |
| 5,912,839 A | | 6/1999 | Ovshinsky et al. |
| 5,933,365 A | | 8/1999 | Klersy et al. |

* cited by examiner

*Primary Examiner*—Douglas A. Wille
*Assistant Examiner*—Theresa T. Doan
(74) *Attorney, Agent, or Firm*—Snell & Wilmer LLP

(57) ABSTRACT

A programmable interconnection system and methods of forming interconnections in the system are disclosed. The system generally includes a metal doped chalcogenide pathway. A metal feature is created within the system by applying a voltage bias across the chalcogenide pathway.

6 Claims, 3 Drawing Sheets

PROGRAMMABLE INTERCONNECTION SYSTEM FOR ELECTRICAL CIRCUITS

RELATED APPLICATIONS

This application claims the benefit of pending Provisional Application Ser. No. 60/098,608, filed Aug. 31, 1998.

TECHNICAL FIELD

The present invention generally relates to methods and apparatus for forming programmable interconnections in electrical circuits. More particularly, the present invention relates to an interconnection system using metal-doped chalcogenide elements as part of the interconnection.

BACKGROUND

A single integrated circuit (IC) chip may contain more than 10 million transistors (i.e., components). These components are then connected using interconnection pathways to form various IC devices. Additional interconnection pathways may be used to connect numerous IC chips to form various electrical circuits and devices.

In conventional interconnection systems, the interconnection pathways are generally patterned along with an IC device. Typically, the pathways are formed of conductive material, such as copper, which are situated and embedded within a supporting dielectric base to interconnect the elements of the IC device. One shortcoming of such conventional interconnection systems, however, is that the interconnections cannot be easily altered once fabrication of the IC device has been completed.

Therefore, the ability to form interconnections in IC devices even after fabrication of the IC devices has been completed is highly desirable as it would allow for an unprecedented level of flexibility in testing, debugging, field configuration, and system reconfiguration of IC devices.

SUMMARY OF THE INVENTION

The present invention relates to methods and apparatus for forming programmable interconnections for electrical circuits. In accordance with an exemplary embodiment of the present invention, programmable interconnections are formed in an electrical circuit by patterning metal-doped chalcogenide pathways in dielectric-separated layers. To connect any two points within the circuit, a voltage is applied to either end of the selected pathway to stimulate the growth of a metal feature (e.g., a metal dendrite) between the two points until a connection is completed.

BRIEF DESCRIPTION OF THE DRAWING FIGURES

The present invention will hereinafter be described in conjunction with the appended drawing figures, wherein like numerals denote like elements, and:

DETAILED DESCRIPTION OF THE INVENTION

In order to provide a more thorough understanding of the present invention, the following description sets forth numerous specific details, such as specific material, parameters, etc. However, these specific details need not be employed to practice the present invention.

Figure 1:
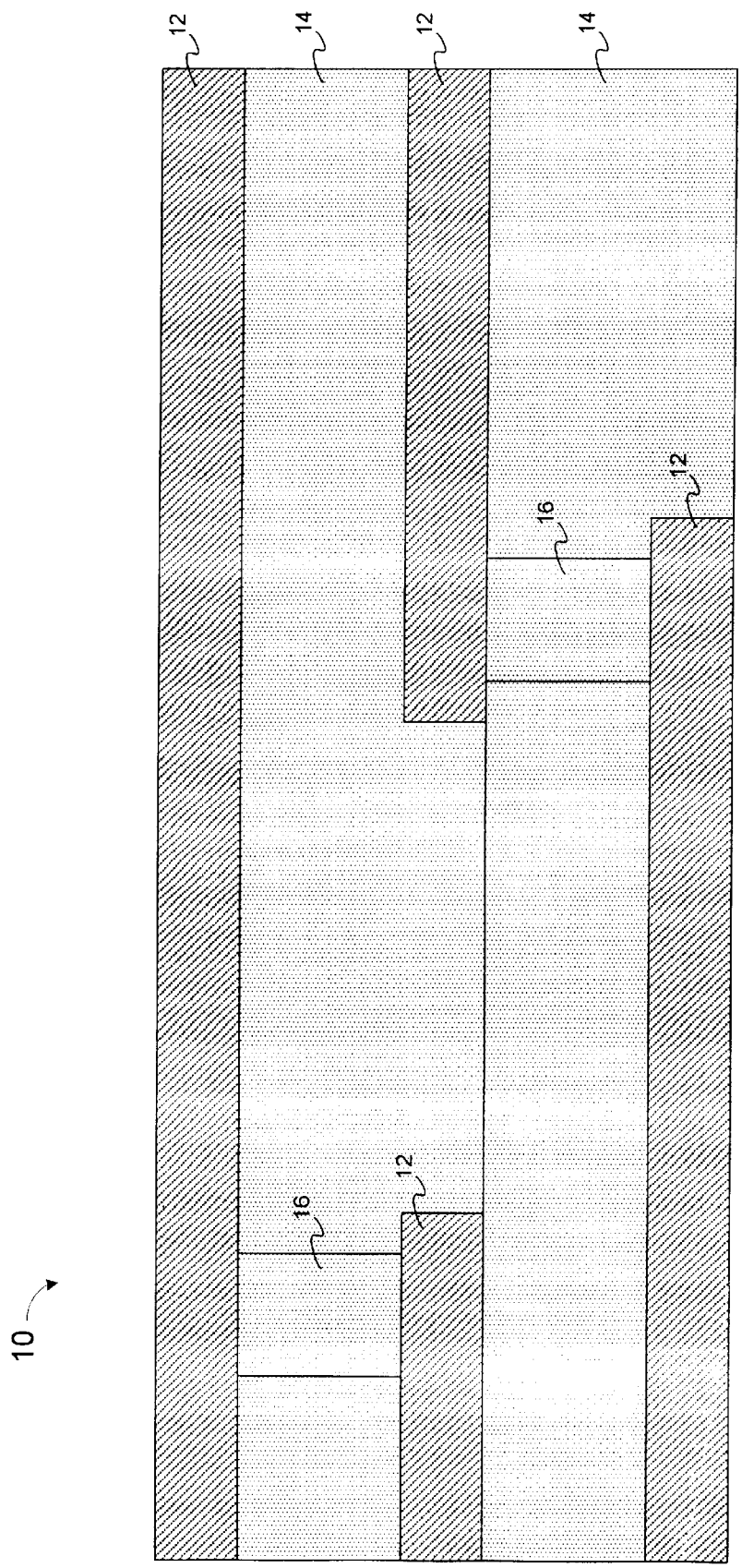
FIG. 1 is a sectional schematic of a multi-level interconnection system in accordance with a preferred embodiment of the present invention.

With reference to FIG. 1, a multi-level programmable interconnection system 10 in accordance with a preferred embodiment of the present invention is shown. In accordance with one aspect of the present invention, interconnection system 10 includes a plurality of metal-doped chalcogenide pathways 12, dielectric separation layers 14, and vias 16.

In accordance with one aspect of the present invention, metal-doped chalcogenide materials are characterized by relatively high resistivity in thin film form (resistivity greater than approximately 10,000 Ohm cm), but are able to produce metal features with high conductivity when an appropriate bias is applied. A suitable metal-doped chalcogenide material may include any compound containing sulfur, selenium and/or tellurium, whether ternary, quaternary or higher compounds. In a preferred embodiment of the present invention, the chalcogenide material is selected from the croup consisting of arsenic, germanium, selenium, tellurium, bismuth, nickel, sulfur, polonium and zinc (preferably, arsenic sulfide, germanium sulfide, or germanium selenide) and the metal comprises various Group I or Group II metals (preferably, silver, copper, zinc or a combination thereof). The metal-doped chalcogenide material may be obtained by photo dissolution, by depositing from a source comprising the metal and chalcogenide, or by other means known in the art. For a more detailed discussion of metal-doped chalcogenide materials, see U.S. Pat. No. 5,761,115, issued on Jun. 2, 1998 to Kozicki et al, the entire disclosure of which is incorporated herein by reference.

Metal-doped chalcogenide pathways 12 may be patterned using any convenient method. For example, for large geometries, pathways 12 can be patterned using known wet-etching techniques. For small geometries, pathways 12 can be patterned using known dry-etching techniques, such as reactive-ion etching.

An appropriate voltage is applied to either end of a selected pathway to stimulate the growth of a metal feature, such as a metal dendrite, to connect any two points along the pathway. For example, when an arsenic trisulfide/silver chalcogenide material is used, a silver dendrite, several hundred microns long, may be grown in a few seconds along the surface of the metal-doped chalcogenide material, thereby connecting two widely-spaced circuit elements with a silver "wire". Alternatively, a copper doped chalcogenide material can be use to establish copper connections.

The interconnection pathways may have bends, vias, and branches (multiple in and multiple out), but the metal dendrite will only grow between the points which have the voltage applied, thereby forming a controllable and directed electrical connection. Additionally, in multi-level systems, as particularly depicted in FIG. 1, the metal dendnite may be formed on any surface (top, bottom or sides) on the metal-doped chalcogenide and may even penetrate through one chalcogenide pathway to allow connections to form from one level to another.

Figure 2:
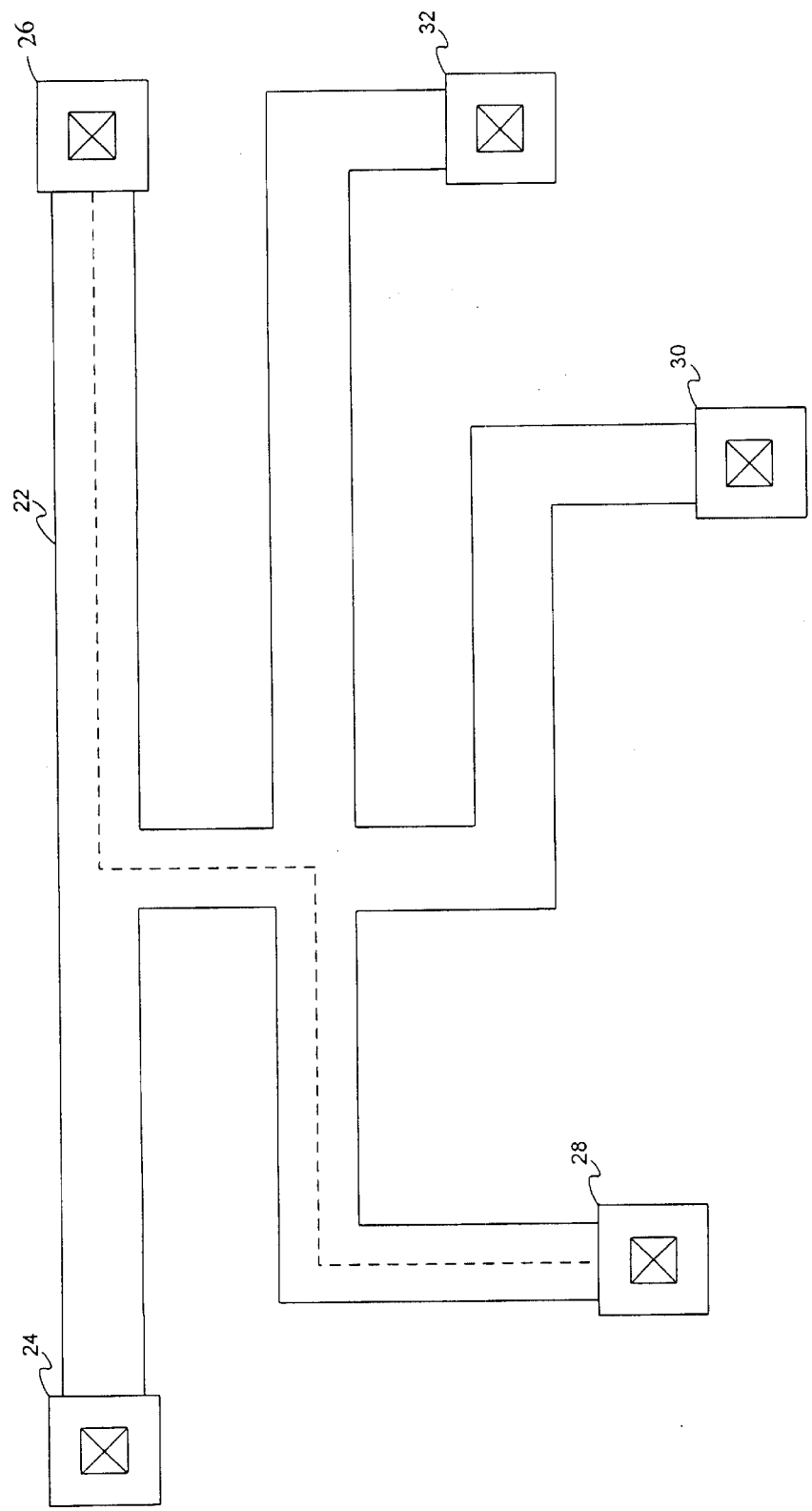
FIG. 2 is a schematic of multiple programmable interconnection pathways in an electrical circuit in accordance with another embodiment of the present invention.

With reference to FIG. 2, in accordance with another embodiment of the present invention, interconnection system 20 includes five arbitrary terminal points 24, 26, 28, 30 and 32 formed within one layer of interconnect. Pathways 22 connecting terminal points 24, 26, 28, 30 and 32 are formed by patterning the metal-doped chalcogenide material using any convenient method. While five terminal points are depicted in FIG. 2, any number of terminal points may be formed without deviating from the spirit and scope of the present invention.

Each terminal point, or any combination of terminal points, is then connected to a power supply by means of an external probe, an on-chip transistor, or other suitable switching device such that a voltage can be applied between any pair or combination of points. For example, if point 26 is connected to a positive rail and point 28 is connected to ground, a metal dendrite will grow from point 26 to point 28 on the surface of the chalcogenide material along pathway 22, between the two points, until the connection is complete.

Figure 3:
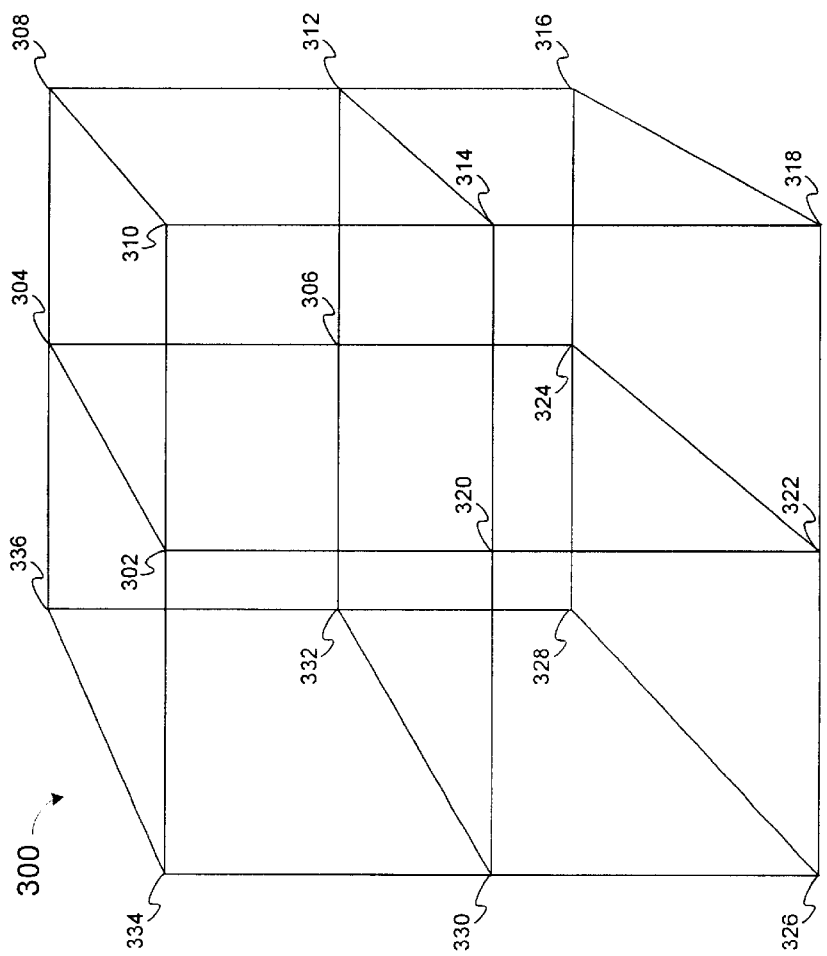
FIG. 3 is a schematic of multiple programmable interconnection pathways in an electrical circuit in accordance with yet another embodiment of the present invention.

With reference to FIG. 3, in accordance with yet another embodiment of the present invention, interconnection system 300 includes 18 terminal points 302, 304, 306, 308, 310, 312, 314, 316, 318, 320, 322, 324, 326, 328, 330, 332, 334 and 336 formed in a dimensionial lattice structure. Alternatively, system 300 may include any number of terminal points formed in any suitable 3-dimensional configuration including amorphous configurations.

Each terminal point, or any combination of terminal points, is connected to a suitable switching device such that a voltage can be applied between any pair or combination of points. For example, if point 306 is connected to a negative rail and point 320 and 324 are connected to ground, a metal dendrite will grow from point 306 to points 320 and 324, thus simultaneously creating two legs 306–320 and 306–324.

In this manner, various interconnections can be established even after fabrication of the circuit. Accordingly, the present programmable interconnection system can be used to increase flexibility in testing, debugging, field programming, and system reconfiguration of electrical circuits.

In accordance with another aspect of the present invention, sacrificial electrodes, consisting of the same metal as used to dope the chalcogenide material, are preferably used to facilitate the growth of stable metal dendrites. These sacrificial electrodes suitably dissolve into the chalcogenide material during growth of the metal dendrites and maintain the metal ion concentration along the length of chalcogenide pathway 22 by a caterpillar mechanism, whereby metal from ions the sacrificial electrodes move in a ripple effect to fill deficiecies created as metal ions leave the chalcogenide material to form the metal dendrite. Additionally, these sacrificial electrodes can be placed at the terminations of the pathways or at isolated points along the pathways to act as stores of metal.

The voltage required to promote the growth the metal dendrites (i.e., the programming voltage) is dependent largely on the initial resistance of the pathway. Thus, the longer the desired connection, the higher the voltage required to form the connection. Additionally, the resistance of the unprogrammed pathways preferably is such that the application of normal operating voltages of the circuit do not stimulate the growth of a connection. In a most preferred embodiment, voltages greater than 10 volts are applied to grow the metal dendrites. Additionally, operating voltages are maintained below 5 volts to prevent unintentional growth of metal dendrites.

While preferred embodiments of the present invention have been shown in the drawings and described above, it will be apparent to one skilled in the art that various embodiments of the present invention are possible. Therefore, the present invention should not be construed as limited to the specific form shown and described above.

I claim:

1. A programmable interconnection system comprising:
   a plurality of metal-doped chalcogenide pathways configured to integrate a portion of a microelectronic circuit;
   a power source coupled to at least one end of each of said plurality of metal doped chalcogenide pathways; and
   a dielectric material interposed between at least two of said pathways.

2. The programmable interconnection system of claim 1, wherein said chalcogenide material includes a material selected from the group consisting of sulfurs, selenium, and tellurium.

3. The programmable interconnection system of claim 1, wherein said chalcogenide material includes a material selected from the group consisting of arsenic, germanium, selenium, tellurium, bismuth, nickel, sulfur, polonium, and zinc.

4. The programmable interconnection system of claim 1, wherein said chalcogenide material is doped with a metal selected from the group consisting of silver, copper, and zinc.

5. The programmable interconnection system of claim 1, further comprising a metal dendrite formed using said chalcogenide material.

6. The programmable interconnection system of claim 1, further comprising a sacrificial electrode.

* * * * *